United States Patent
Yeh et al.

(10) Patent No.: US 6,642,554 B2
(45) Date of Patent: Nov. 4, 2003

(54) MEMORY MODULE STRUCTURE

(75) Inventors: Nai Hua Yeh, Hsinchu Hsien (TW); Chen Pin Peng, Hsinchu Hsien (TW); Chief Lin, Hsinchu Hsien (TW); C. S. Cheng, Hsinchu Hsien (TW); Kuang Yu Fan, Hsinchu Hsien (TW); Ren Long Kau, Hsinchu Hsien (TW); Fu Yung Huang, Hsinchu Hsien (TW); Yves Huang, Hsinchu Hsien (TW); Wu Hsiang Lee, Hsinchu Hsien (TW); Chih Hsien Chung, Hsinchu Hsien (TW); May Chen, Hsinchu Hsien (TW)

(73) Assignee: Kingpak Technology, Inc., Hsinchu Hsien (TW)

( * ) Notice: Subject to any disclaimer, the term of this patent is extended or adjusted under 35 U.S.C. 154(b) by 56 days.

(21) Appl. No.: 09/996,675

(22) Filed: Nov. 21, 2001

(65) Prior Publication Data

US 2003/0094628 A1 May 22, 2003

(51) Int. Cl.$^7$ ............................................. H01L 31/072
(52) U.S. Cl. ...................... 257/200; 257/686; 257/777; 361/748; 361/761; 361/764; 361/790

(58) Field of Search .................................. 257/686, 777; 361/790, 748, 761, 764

(56) References Cited

U.S. PATENT DOCUMENTS 5,737,192 A * 4/1998 Linderman .................. 257/686

* cited by examiner

Primary Examiner—David Nelms
Assistant Examiner—Mai-Huong Tran
(74) Attorney, Agent, or Firm—Pro-Techtor International Services

(57) ABSTRACT

A memory module structure of the invention is used for being assembled on a locking device. The memory module includes a substrate and a plurality of memories. The substrate has certain long sides and short sides. Notches are formed on the short sides for being secured by the locking device. Each of the plurality of memories has a suitable length and width. Some memories of the plurality of memories are transversely mounted on the substrate with respect to the substrate. The other memories of the plurality of memories are longitudinally mounted on the substrate with respect to the substrate. According to this structure, it is possible to suitably arrange a plurality of memories on the substrate so as to increase the memory capacity of the memory module.

8 Claims, 2 Drawing Sheets

MEMORY MODULE STRUCTURE

BACKGROUND OF THE INVENTION

1. Field of the Invention

The invention relates to a memory module structure, in particular to a module design having a high capacity up to 512 MB.

2. Description of the Related Art

As shown in FIG. 1, a conventional memory module is illustrated. The memory module is formed by arranging a plurality of dynamic random access memories 10 on a substrate 12. By the combination of the plurality of dynamic random access memories 10, the memory module may have the capacity of 64 MB, 128 MB, 256 MB or 512 MB. The substrate 12 is formed with two notches 16 at its two sides, respectively. Thus, the substrate 12 may be secured by the locking device 14 secured in the notches 16 so that the memory module can be secured.

Since the size of the substrate 12 is limited by the specification of the locking device 14, all substrate 12 have a length of 67.6 mm and a width of 31.75 mm. If the dynamic random access memory is packaged by a conventional TSOP (thin small outline package), the volume of the package is relatively large. Thus, it is impossible to arrange plural dynamic random access memories on the substrate 12 and to produce a memory module having a high capacity.

Moreover, please refer to FIG. 2. If the memory is packaged by way of a chip scale package (CSP), a package having a smaller size can be obtained. However, if eight memories are intended to be arranged on the substrate 12 to constitute a memory module having a capacity of 512 MB, the memory module occupies most space of the substrate 12. Thus, it is not so easy to layout the wires on the substrate 12 and to prevent the memories 10 from contacting the notches 16. In this case, the engagement between the locking device 14 and the notches 16 is adversely influenced.

In view of the above-mentioned problems, it is therefore an object of the present inventor to provide a memory module structure capable of efficiently arranging plural packaged memories on the substrate 12 having a certain size without adversely influencing the wire layout on the substrate 12. Thus, the capacity of the memory module can be increased.

SUMMARY OF THE INVENTION

It is a primary object of the invention to provide a memory module structure capable of arranging plural memories on the substrate to increase the capacity of the memory module.

To achieve the above-mentioned objects, the invention is characterized in that a memory module structure is used for being assembled on a locking device. The memory module includes a substrate and a plurality of memories. The substrate has certain long sides and short sides. Notches are formed on the short sides so that the substrate can be secured by the locking device. Each of the plurality of memories has a suitable length and width. Some memories of the plurality of memories are transversely mounted on the substrate with respect to the substrate. The other memories of the plurality of memories are longitudinally mounted on the substrate with respect to the substrate. According to this structure, it is possible to suitably arrange a plurality of memories on the substrate so as to increase the memory capacity of the memory module without adversely influencing the wire layout on the substrate.

BRIEF DESCRIPTION OF THE DRAWINGS

These and other objects and advantages of the present invention will become apparent by reference to the following description and accompanying drawings wherein.

DETAIL DESCRIPTION OF THE INVENTION

Figure 1:
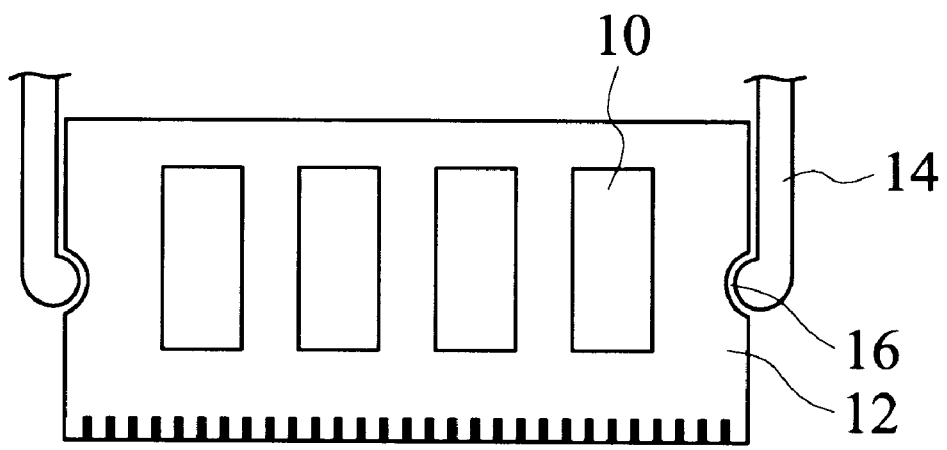
FIG. 1 is a schematic illustration showing a conventional memory module.
Figure 2:
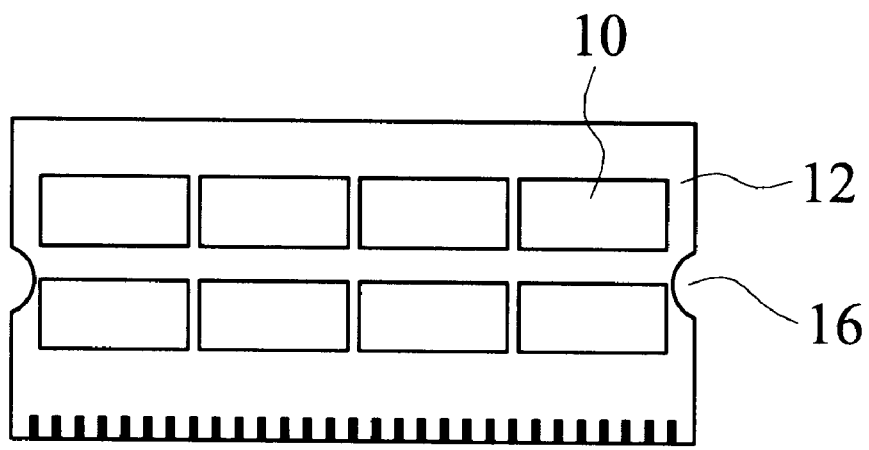
FIG. 2 is a schematic illustration showing another conventional memory module.
Figure 3:
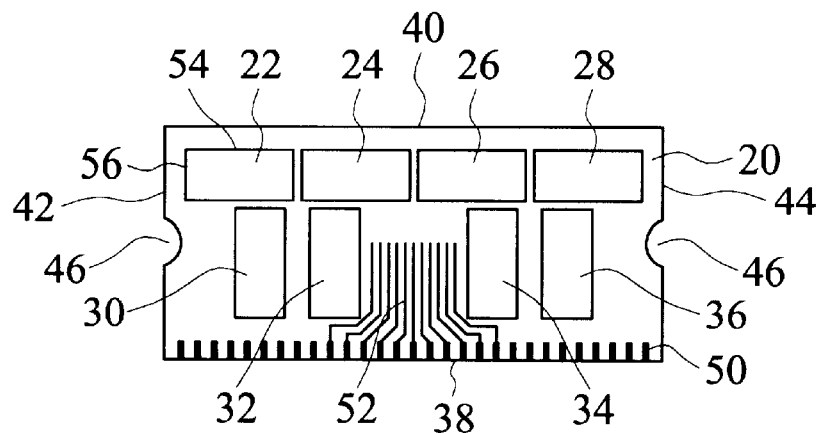
FIG. 3 is a schematic illustration showing a memory module structure of the invention.

Referring to FIG. 3, the memory module in accordance with an embodiment of the invention includes a substrate 20 and eight memories 22, 24, 26, 28, 30, 32, 34 and 36.

The substrate 20 has long sides 38 and 40 and short sides 42 and 44. The length of each of the long sides 38 and 40 is 67.6 mm, while the length of each of the short sides 42 and 44 is 31.75 mm. Notches 46 are formed on the short sides 42 and 44 so that the substrate 20 can be secured by a locking device 48. Thus, the substrate 20 can be more efficiently secured. Golden fingers 50 are formed at a long side 38 for outputting electrical signals. A region is formed near another long side 40 for receiving memories 22, 24, 26 and 28. A plurality of wires 52 electrically connecting to the golden fingers 50 are arranged on the substrate 20.

Each of the eight memories 22, 24, 26, 28, 30, 32, 34 and 36 has a suitable long side 54 and short side 56. The length of the long side 54 may be, for example, 15.5 mm. The length of the short side 56 may be, for example, 9 mm. The foure memories 22, 24, 26 and 28 are transversely arranged near the long side 40 of the substrate 20 with respect to the substrate 20. Another four memories 30, 32, 34 and 36 are longitudinally arranged between the long side 40 of the substrate 20 and the golden fingers 50 with respect to the substrate 20. In this case, a larger region at the center portion of the substrate 20 can be provided for arranging wires 52 that are used for electrically connecting to the golden fingers 50. Also, each of the memories 22, 24, 26, 28, 30, 32, 34 and 36 can be away from the notches 46 on the substrate 20.

Figure 4:
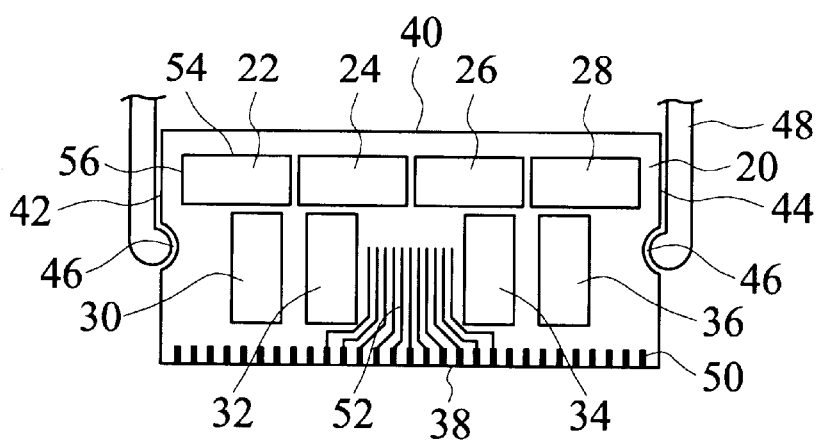
FIG. 4 is a schematic illustration showing the memory module structure in use.

Referring to FIG. 4, which shows the situation that the memory module is assembled on the locking device 48. Since each memory is away from the notches 46, the memories are free from being damaged by the locking device 48 when the locking device 48 engages with the notches 46 of the substrate 20. Thus, a higher yield of the memory module may be obtained.

Figure 5:
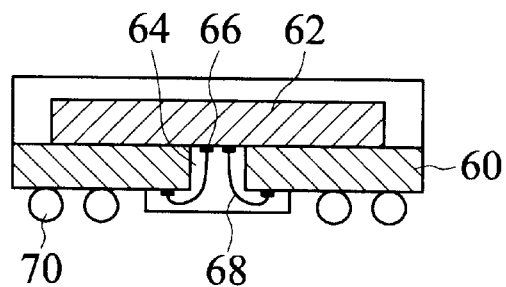
FIG. 5 is a cross-sectional view showing the memory module structure of the invention.

Referring to FIG. 5, each of the memories 22, 24, 26, 28, 30, 32, 34 and 36 is packaged into a chip scale package by way of central leads. The chip scale package includes a base layer 60 and a chip 62. The base layer 60 has a cavity 64. The chip 62 has a plurality of bonding pads 66 and is packaged on the base layer 60. The bonding pads 66 on the chip 62 are exposed through the cavity 64 and are electrically connected to the metallic balls (ball grid array) 70 through a plurality of wires 68 to complete the package of the memories.

According to the above-mentioned structure, the memory module structure of the invention has the following advantages.

1. Eight memories each having a certain size can be arranged on the substrate 20 having a certain size without adversely influencing the wire layout on the substrate 20.

2. When the memory module is secured on the locking device 48, any memory are free from been damaged by the locking device 48 so that the yield of the memory module can be improved.

3. A lot of memories can be arranged on the substrate 20 for increasing the capacity of the memory module.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A memory module structure for being assembled on a locking device, the memory module comprising:
   a substrate having certain long sides and short sides, notches being formed on the short sides for being secured by the locking device; and
   a plurality of memories, each of which having a suitable length and width, wherein some memories of the plurality of memories are transversely mounted on the substrate with respect to the substrate, and the other memories of the plurality of memories are longitudinally mounted on the substrate with respect to the substrate.

2. The memory module structure according to claim 1, wherein the length of each long side of the substrate is 67.6 mm, and the length of each short side is 31.75 mm.

3. The memory module structure according to claim 1, wherein four memories of the plurality of memories are transversely mounted on the substrate with respect to the substrate, and the other four memoris of the plurality of memories are longitudinally mounted on the substrate with respect to the substrate.

4. The memory module structure according to claim 1, wherein each of the memories has a length of 15.5 mm and a width of 9 mm.

5. The memory module structure according to claim 1, wherein each of the memories is packaged by way of central leads.

6. The memory module structure according to claim 1, wherein the memory module has a capacity of 512 MB.

7. The memory module structure according to claim 1, wherein the length of the long side of the substrate is 67.6 mm, the length of the short side of the substrate is 31.75 mm, the length of each of the memories is 15.5 mm, and the width of each of the memories is 9 mm.

8. The memory module structure according to claim 1, wherein each of the memories is packaged by way of a chip scale package.

* * * * *